United States Patent [19]
Beall

[11] 4,258,086
[45] Mar. 24, 1981

[54] METHOD OF REPRODUCTION METALLIZED PATTERNS WITH MICROWAVE ENERGY

[75] Inventor: Nelson J. Beall, St. Michael, Minn.

[73] Assignee: General Mills, Inc., Minneapolis, Minn.

[21] Appl. No.: 106,956

[22] Filed: Dec. 26, 1979

Related U.S. Application Data

[63] Continuation of Ser. No. 950,758, Oct. 12, 1978, abandoned, which is a continuation-in-part of Ser. No. 910,552, May 30, 1978, abandoned.

[51] Int. Cl.³ .............................................. C03C 15/00
[52] U.S. Cl. ................................ 219/10.43; 156/272; 156/643; 427/46; 427/272; 430/198; 430/295; 430/297

[58] Field of Search ................... 427/45, 46, 271, 272, 427/282, 145, 43; 219/10.43, 10.55 M; 204/157.1 R, 157.1 H; 264/25; 156/272, 155, 273, 643

[56] References Cited

U.S. PATENT DOCUMENTS

| | | | |
|---|---|---|---|
| 3,243,784 | 3/1966 | Anderson et al. | 427/145 X |
| 4,149,322 | 4/1979 | Minoda et al. | 427/45 X |

*Primary Examiner*—William A. Powell
*Attorney, Agent, or Firm*—Gene O. Enockson; L. MeRoy Lillehaugen

[57] ABSTRACT

A foil laminated board having a pattern formed in the metallic foil is placed in close contact with a metallized substrate such as a metallized plastic film. The two metal surfaces are subjected to a microwave energy field which duplicates or copies the foil pattern on the metallized substrate or film.

16 Claims, 8 Drawing Figures

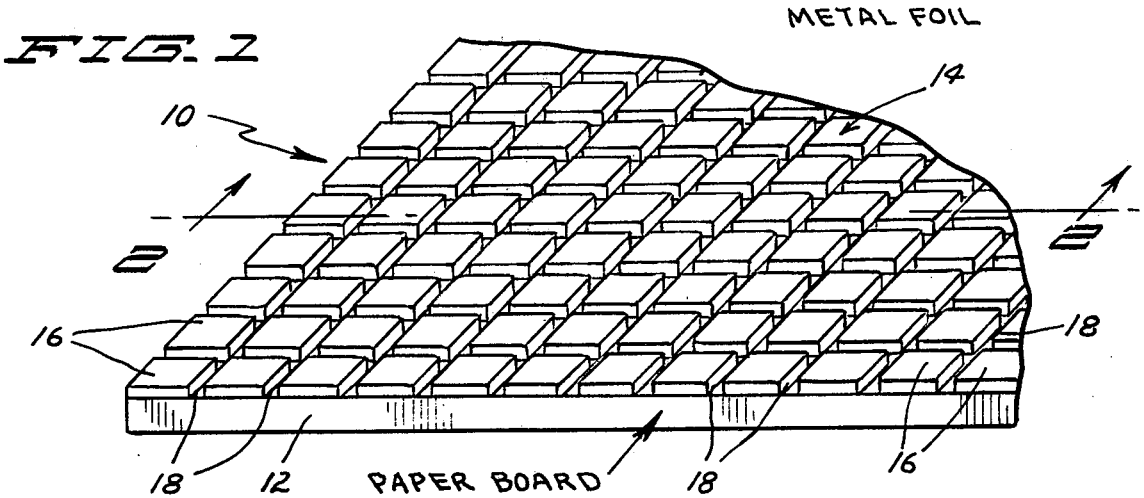
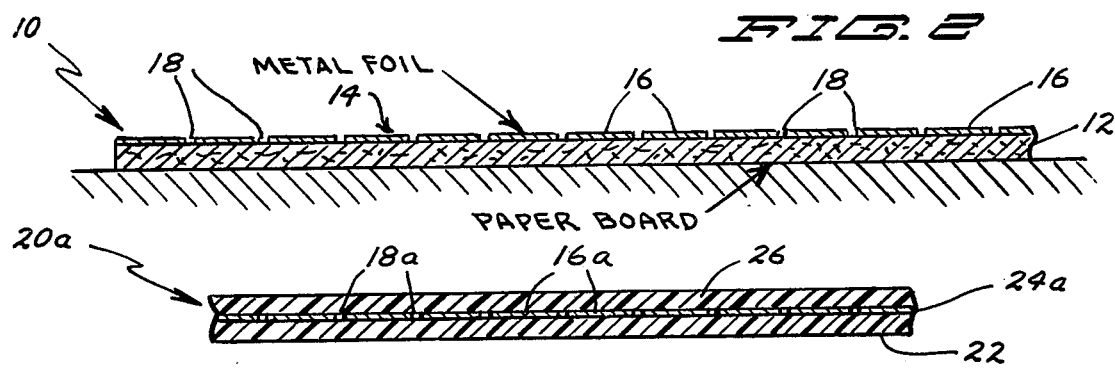
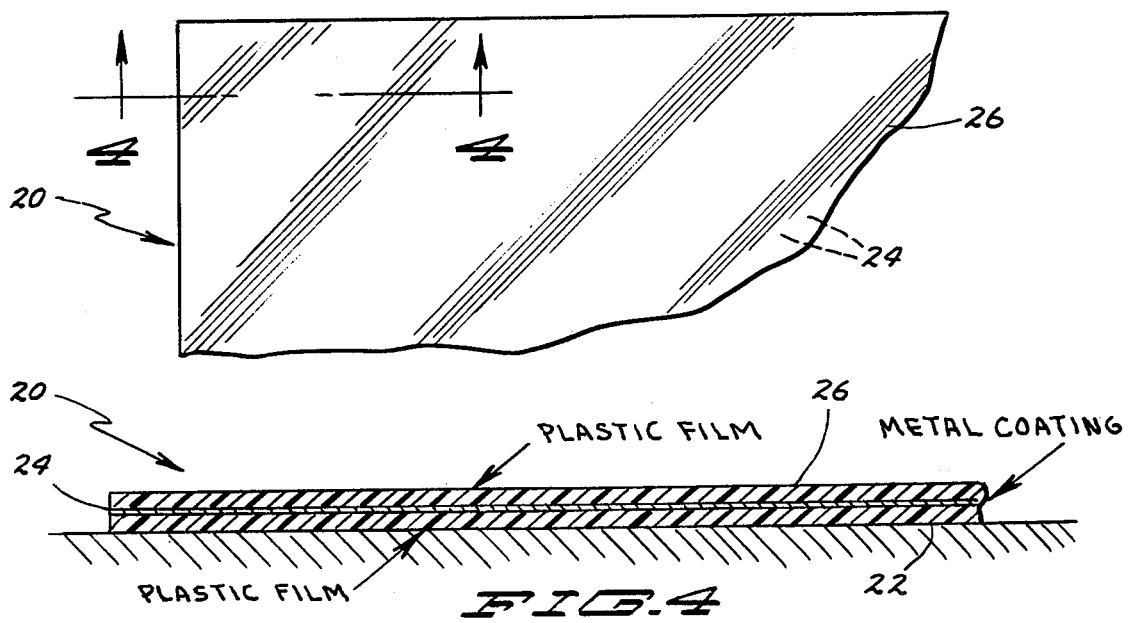

METHOD OF REPRODUCTION METALLIZED PATTERNS WITH MICROWAVE ENERGY

BACKGROUND OF THE INVENTION

This application is a continuation of my earlier filed application Ser. No. 950,758, filed Oct. 12, 1978, now abandoned which in turn was a continuation-in-part of my earlier filed application Ser. No. 910,552, filed May 30, 1978, and now abandoned.

This invention relates generally to reproducing a pattern contained on one metallic surface on a second metallic surface, and pertains more particularly to copying the pattern by means of microwave energy.

The heating of food articles with microwave energy has now become quite common. However, lacking some special arrangement, usually either a modification of the microwave oven or employment of a special utensil, the high frequency oscillations fail to produce the desired amount of browning. It will be appreciated that some foods simply are not appealing, either to the eye or to one's taste, without some color being present. Also, some foods are not sufficiently crisp unless their outer surface is appropriately heated.

It is contemplated that material produced in accordance with my invention will find especial utility in the microwave browning of foods. Certain simple metallized patterns incorporated into the wrapping material have been found particularly suitable for producing the requisite browning. Included in such materials is the so-called metallized film which is fabricated by placing a plastic film, such as polyester, within a vacuum chamber where a suitable metal, such as aluminum, is vaporized and deposited onto one side of the film. Since the metal coating is extremely thin, usually on the order of one micron or less, portions of the metal coating cannot be easily removed by mechanical techniques in order to produce an appropriate pattern for achieving microwave browning. Also, the metallizing is frequently covered by a second protective plastic film which prevents physical access to the metal coating; in other words the metal coating, under these circumstances, is sandwiched between two layers of plastic.

SUMMARY OF THE INVENTION

Accordingly, one object of my invention is to provide a simple method for reproducing a given pattern that has been formed on one metallic surface, duplicating such pattern on a second metallic surface. More specifically, an aim of the invention is to form the desired pattern on a metal foil laminated or adhered to a sheet of paperboard which functions as a dielectric substrate, and then use such pattern as a master by placing the foil against the metallized coating on a film of plastic, paper, paperboard or the like substrate. By subjecting the two laminates to a field of microwave energy, portions of the metallic coating will be removed to duplicate the pattern provided by the master.

Another object is to reproduce a pattern formed on one metallic surface on a second metallic surface where the second metallic surface is protected by a plastic film.

Another object of the invention is to provide a method that lends itself readily to mass production of duplicate patterns. In this way, packaging material can be easily and economically fabricated which will produce the desired degree of browning on the surface of the food about which it is wrapped when the entire package is placed in a microwave oven for the heating or cooking of the food. Also, it is an aim of the invention not to degrade or lessen the fidelity of the master pattern due to continued use in the making of reproductions.

Yet another object of the invention is to subdivide a metallic coating to form a number of islands separated by insulating or dielectric gaps in which the size of the islands and the width of the gaps can be accurately reproduced.

A further object is to duplicate patterns on a metallized plastic film in such a way that the plastic film will not shrink from the heat generated during the reproduction process.

Another object of the invention is to provide a metallized film with a desired pattern, the technique being sufficiently inexpensive so that the cost is only negligibly increased. Consequently, when used as a packaging material, it can be discarded after the contents of the package have been used just as conventional wrapping material is now thrown away.

Still further, another object of the invention is to produce a patterned packaging material suitable for browning food in a microwave oven that will have an extremely small thermal mass, thereby transmitting the microwave energy that is converted to infrared energy directly into the food and not causing a heat loss by reason of any residual heat remaining in the wrapping material.

Also, an object is to provide wrapping material for food that will preferably be extremely flexible and which will readily conform to the shape of the food, thereby providing a uniform and controlled heating of the food surface against which the wrapping material bears.

While other techniques exist, an object of this invention is to offer a method for reproducing a desired pattern from a master that is both simple and economical. In this regard, an aim is to inexpensively duplicate a pattern in an extremely thin metallic coating which is difficult to do with a mechanical process, and which cannot be done when the metallic coating is already covered with a plastic film.

Briefly, my invention contemplates the mechanical forming of a suitable pattern composed of metallic islands and insulating or dielectric gaps therebetween, using an aluminum foil which has been laminated to one side of conventional paperboard. Since the aluminum foil is relatively thick, actually on the order of 0.00035 inch, it can be mechanically worked to form various patterns.

On the other hand, metallized plastic films, normally fabricated by vacuum techniques, involve a very thin metallic film or coating on a plastic film substrate, such as a sheet of polyester. When the foil surface is placed in close contact with the metallized coating on the plastic film and the two laminates inserted into a microwave oven, the microwave oven will generate differences of electric potential between adjacent metallic islands of the aluminum foil which are capacitively coupled to subjacent areas of the very thin metallic coating on the plastic film. The potential differences between these areas of the metallic coating cause currents which heat and vaporize the coating between said areas. In any event, the regions between the foil islands thus are sufficiently stressed so as to remove as by melting away or evaporating the confronting regions of the metallic coating, thereby creating gaps or insulating strips on the metallic coating corresponding to those contained in the foil, thereby leaving metallic islands intermediate such gaps. Stated somewhat differently, the thin metallic film or coating on the plastic film is simply removed to leave regions of the underlying substrate exposed, the underlying substrate being the plastic film. In a broad sense, the technique can be termed "electromechanical etching."

BRIEF DESCRIPTION OF THE DRAWINGS

FIG. 1 is a fragmentary perspective view of a master unit having a metal foil laminated to paperboard, the metal foil containing a desired pattern formed therein;

FIG. 2 is a sectional detail taken in the direction of line 2—2 of FIG. 1;

FIG. 3 is a top plan view of metallized plastic film prior to reproducing the pattern of FIG. 1 thereon;

FIG. 4 is an enlarged sectional view taken in the direction of line 4—4 of FIG. 3, the scale being the same as that of FIG. 2 in order to portray the extreme thinness of the metallic coating with respect to the metal foil of FIG. 2;

FIG. 8 is a sectional view taken in the direction of line 8—8 of FIG. 7.

DESCRIPTION OF THE PREFERRED EMBODIMENT

Figure 5:
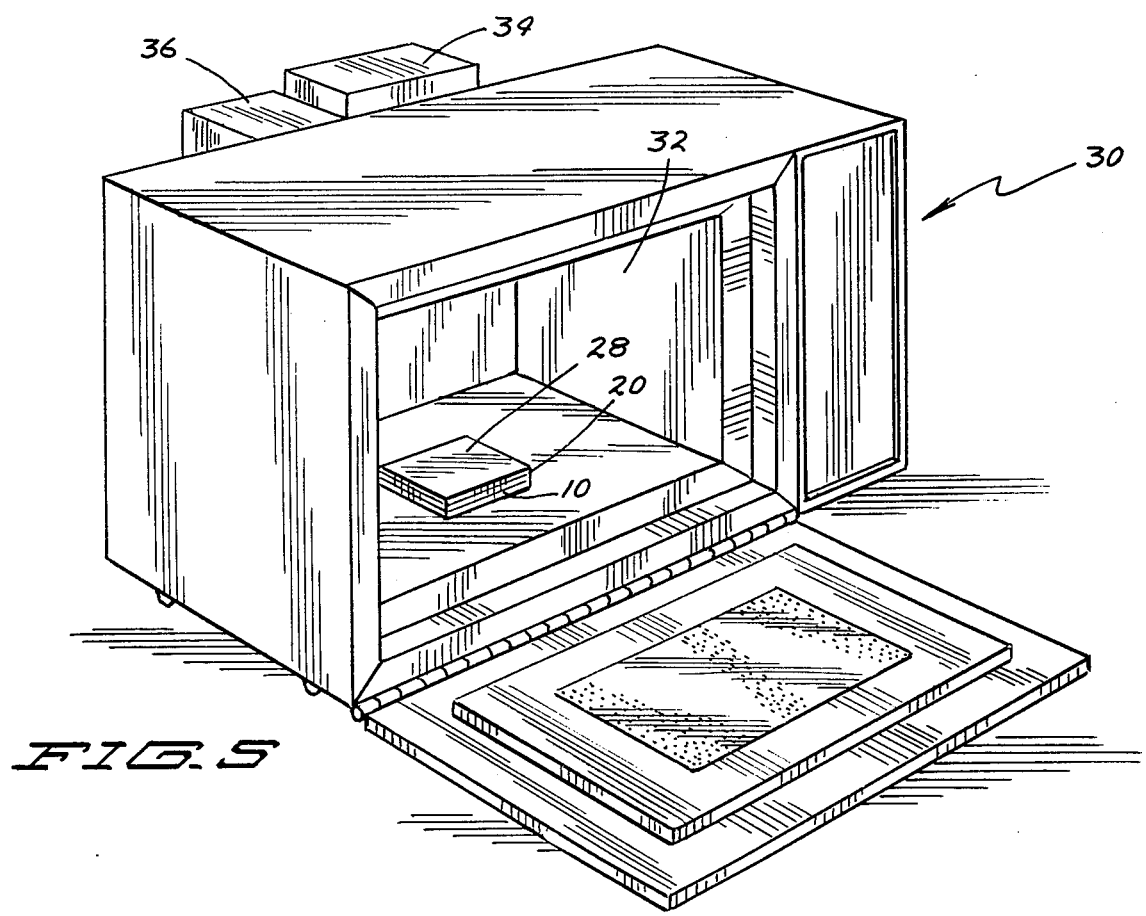
FIG. 5 is a perspective view of a microwave oven depicting the components of FIGS. 1 and 3, together with a hold-down glass pane, after they have been placed therein.

Referring first to FIG. 1, the master unit or component depicted in this figure has been assigned the reference numeral 10. It includes a paperboard dielectric substrate 12 having aluminum foil 14 adhered thereto. The thickness of the paperboard 12 can vary quite widely; typically, paperboard of the envisaged character will be approximately 1/32" thick. The aluminum foil is typically 0.00035" thick.

Owing to the relative thickness of the aluminum foil 14, it can be mechanically cut or severed to form a desired pattern. For the wider gap patterns, the severed portions may be removed from the paperboard 12 without damage thereto. When the reproduced pattern is to be used for microwave heating, a pattern composed of a number of metallic islands or pads 16 with dielectric gaps or strips 18 therebetween is employed. Of course, when the aluminum foil 14 is mechanically cut or severed to form the gaps or strips 18, it is the exposed portions of the paperboard 12 itself that form the dielectric separations between the various islands 16.

In practice, the size of the metallic islands 16 can be varied and also the width of the gaps 18 therebetween. For instance, the metallic islands 16 can constitute squares, varying from about 1/32" on a side to about ¾" on a side, and preferably from about 1/16" to about ¼". The gaps or dielectric strips 18 therebetween should be narrower when the smaller size islands are employed and the widths of the gaps can vary from 0.0001 to 0.0625 inch in width.

Consequently, it will be recognized that the various metallic islands 16 and the gaps 18 therebetween form a preferred pattern in the illustrative instance. The main objective of the present invention is to duplicate such a pattern, doing so on metallized plastic film.

Accordingly, attention is now directed to FIGS. 3 and 4 where a metallized film unit or component 20 is depicted. Typically, the unit 20 includes a plastic film 22, such as a thin sheet of polyester, functioning as a dielectric substrate. The film 22 is typically 0.0005 inch thick. The thickness is not particularly critical other than that where the plastic film 22 is quite thin, then care must be exercised to assure that it will not shrink from the heat that is generated in reproducing the pattern appearing in FIG. 1. This will become more readily apparent as the description progresses.

At this time, it will be pointed out that the unit includes a thin metallic film or metallized coating 24, such as aluminum, which has been evaporated onto the plastic film 22. Inasmuch as vaporized coatings are less than one micron thick (about 0.1 micron), it will be appreciated that considerable difficulty would be encountered in reproducing the pattern of FIG. 1 by known mechanical means. However, when practicing my invention, the pattern duplication can be easily and economically realized. Since the metallized coating 24 is so thin, it will be recognized that its thickness cannot be shown in proportion to the thickness of other elements, such as the thickness of the plastic film or dielectric substrate 22.

To protect the metallizing from abrasion, an additional plastic film 26, such as a thin layer of polyethylene, may be laminated to the metallized coating 24. Since the pattern of FIG. 1 involving the islands 16 and gaps 18 is to be copied onto the metallic coating 24, the presence of the additional plastic film 26 poses an "access" problem which my invention effectively and easily overcomes, as will soon become manifest.

Figure 6:
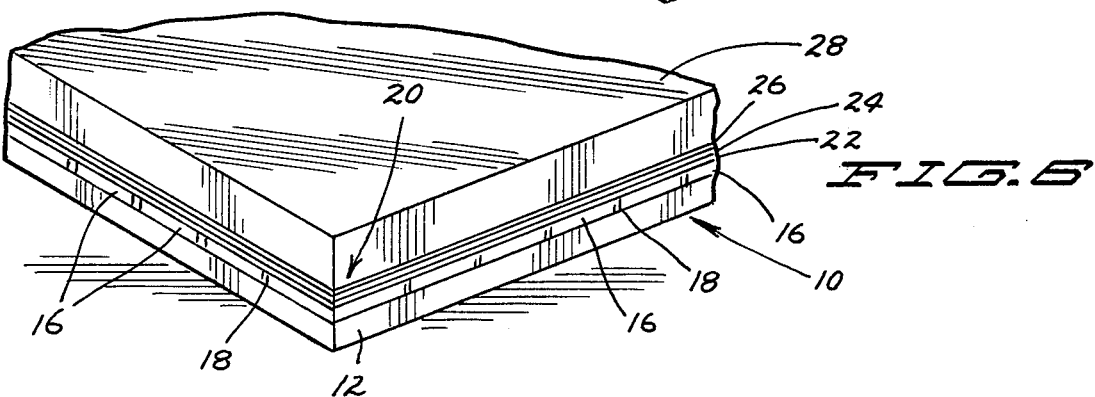
FIG. 6 is an enlarged fragmentary perspective view of the several components as they appear in FIG. 5.

To reproduce the pattern appearing in FIG. 1, the foil 14 of the master unit 10, containing the pattern composed of the metallic islands 16 and gaps 18, is positioned in close contact with the metallized surface or coating 24. A pane of glass 28 can be placed over the unit 20, more specifically against the film 26, as can be better understood from FIG. 6. However, the unit 20 can be inverted so that the plastic film 22 is uppermost.

FIG. 5 depicts a conventional microwave oven 30 having the usual cooking cavity 32 into which microwave energy having a frequency of 2450 MHz is introduced from a microwave generator 34 via a waveguide 36. A magnetron constitutes the usual generator 34 provided with commercially sold microwave ovens.

When the master unit and film are placed together, as shown in the cavity 32, the next step is to energize the microwave oven 30 for only a few seconds. When this combination is subjected to the high frequency field, differences in electric potential are generated between adjacent islands 16, which acts as plates of a capacitor and couple these potential differences to subjacent areas 16a of the thin metallic coating 24. This creates a sufficient amount of resistive heat so as to remove portions of the metallized coating 24 facing the dielectric gaps 18. The removal of the metallized coating 24 in areas where the gaps 18 exist reproduce the pattern of FIG. 1. The presence of the plastic film 26 does not interfere with the removal of strip portions of the very thin coating 24. My invention, it can be pointed out, functions admirably where the additional film is either present or absent.

Figure 7:
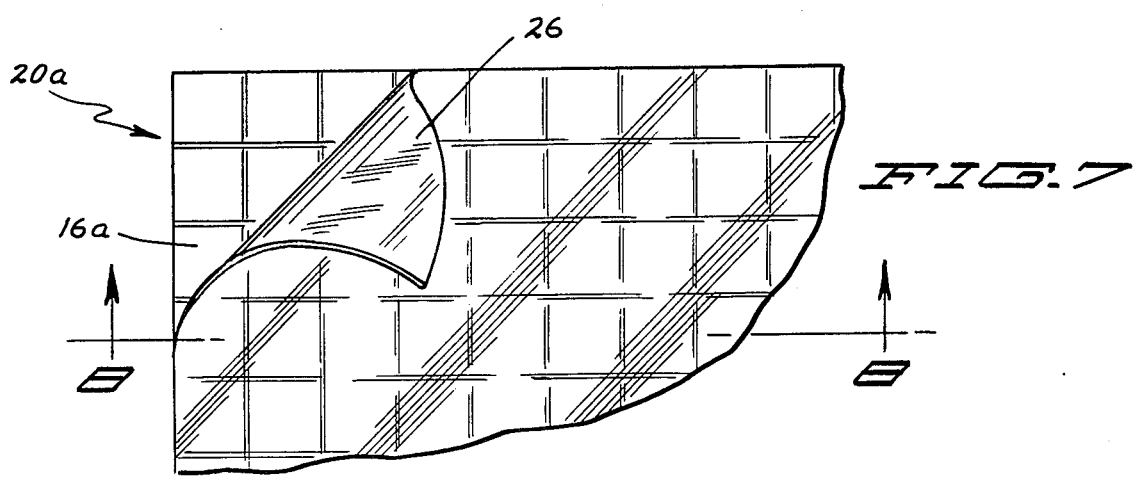
FIG. 7 is a top plan view corresponding to FIG. 3 but after the pattern of FIG. 1 has been duplicated thereon, a corner of the overlying protective plastic film being peeled back to expose to view the square islands formed during the duplicating procedure.

It is thought that the foregoing process is readily straightforward. Since the unit 20 has now been modified, it has been re-labeled as 20a in FIGS. 7 and 8, the unit 20a containing the reproduced pattern derived from the unit 10. Since the islands 16a and the gaps 18a of FIGS. 7 and 8 (although somewhat narrower than the gaps 18 of FIGS. 1 and 2) are of the same configuration as the islands 16 and gaps 18 in FIG. 1 they have been distinguished solely by the suffix "a." Therfore, the metallic coating 24, now containing the islands 16a, has been given the reference numeral 24a. The plastic films 22 and 26, however, remain unchanged in FIGS. 7 and 8, so do not carry the "a" suffix.

It is important to appreciate that the thermal mass of the metallic coating 24 is very small because of the extreme thinness of vacuum-applied or vapor-coated metal film (one micron or less). Only a very brief interval of time is needed to effect the "electromechanical etching" or disintegration or disruption of the metallic coating 24 to duplicate the island and gap pattern of FIG. 1. The plastic films 22 and 26 are of sufficient thickness in relation to the coating 24 so that neither will be heated sufficiently to cause any shrinkage thereof.

I claim:

1. A method of reproducing a pattern formed on the metallized surface of a first dielectric substrate on the metallized surface of a second dielectric substrate comprising the steps of placing said metallized surfaces in a proximal relation, and subjecting said surfaces to microwave energy for a time sufficient to remove metal from the metallized surface of said second substrate in accordance with the pattern formed on the metallized surface of said first substrate.

2. The method of claim 1 in which the metallized surface of said first substrate is thicker than that of said second substrate.

3. The method of claim 2 in which the metallized surface of said first substrate constitutes a metal foil with portions thereof removed to expose underlying dielectric surface portions of said first substrate.

4. The method of claim 3 in which the metallized surface of said second substrate constitutes a thin metallic coating.

5. The method of claim 4 in which said first substrate constitutes a sheet of paperboard and said second substrate constitutes a sheet of plastic film.

6. The method of claim 5 including a second plastic film, said metallic coating being between the first plastic film and said second plastic film.

7. The method of claim 1 in which said pattern is composed of metallic regions separated by nonmetallic regions.

8. The method of claim 7 in which said metallic regions constitute rectangular islands and said nonmetallic regions constitute dielectric strips therebetween.

9. The method of claim 8 in which said islands are from about 1/32 to ¾ inch on a side and said gaps are from 0.0001 to 0.0625 inch in width.

10. The method of claim 9 in which said islands are from about 1/16 to ¼ inch on a side.

11. The method of claim 9 in which said islands are formed from a metal foil having a thickness on the order of 0.00035 inch and the metallized surface of said second substrate constitutes a metallic coating having a thickness on the order of 1.0 micron or less.

12. The method of claim 11 in which said first substrate constitutes a sheet of paperboard and said second substrate constitutes a layer of polyester plastic.

13. The method of claim 12 including a layer of polyethylene plastic, said metallic coating being sandwiched between said layers.

14. The method of claim 12 in which said paperboard is approximately 0.020 inch thick and said film is approximately 0.005 inch thick.

15. A method of removing metal from selected areas of a thin metallic coating formed on a first dielectric substrate, the method comprising the steps of placing a metallic foil laminated to a second dielectric substrate in close contact with said thin metallic coating, said foil having a number of metallic islands and dielectric gaps therebetween to form a pattern, and subjecting said substrates and their metallized surfaces to microwave energy for a predetermined period of time sufficient to remove some of said metallic coating in the regions confronted by said dielectric gaps and thus duplicate said pattern.

16. The method of claim 15 in which said metallic coating has a thickness of approximately 0.1 micron and said foil has a thickness of approximately 0.00035 inch.

* * * * *